United States Patent
Govil et al.

(10) Patent No.: US 6,556,281 B1
(45) Date of Patent: Apr. 29, 2003

(54) FLEXIBLE PIEZOELECTRIC CHUCK AND METHOD OF USING THE SAME

(75) Inventors: Pradeep Kumar Govil, Norwalk, CT (US); Jorge Ivaldi, Trumbul, CT (US)

(73) Assignee: ASML US, Inc., Wilton, CT (US)

( * ) Notice: Subject to any disclaimer, the term of this patent is extended or adjusted under 35 U.S.C. 154(b) by 0 days.

(21) Appl. No.: 09/575,998

(22) Filed: May 23, 2000

(51) Int. Cl.⁷ .................. G03B 27/58; G03B 27/60; G03B 27/32; A61N 5/00; G03C 5/00

(52) U.S. Cl. .............. 355/72; 355/73; 355/74; 355/77; 250/492.2; 250/492.22; 430/311; 430/314; 430/322

(58) Field of Search .............. 355/72, 73, 74, 355/77; 250/492.2, 492.22; 430/311, 314, 322

(56) References Cited

U.S. PATENT DOCUMENTS

| | | | |
|---|---|---|---|
| 4,391,511 A | 7/1983 | Akiyama et al. ............ 335/40 |
| 4,475,223 A | * 10/1984 | Taniguchi et al. | |
| 4,504,045 A | 3/1985 | Kenbo et al. ............ 269/21 |
| 4,504,144 A | 3/1985 | Trost ............ 356/150 |
| 4,530,635 A | 7/1985 | Engelbrecht et al. ....... 414/627 |
| 4,846,626 A | 7/1989 | Engelbrecht ............ 414/754 |
| 4,973,217 A | 11/1990 | Engelbrecht ............ 414/754 |
| 5,094,536 A | 3/1992 | MacDonald et al. ....... 356/358 |
| 5,202,748 A | 4/1993 | MacDonald et al. ....... 356/360 |
| 5,333,167 A | 7/1994 | Iizuka et al. ............ 378/35 |
| 5,563,684 A | 10/1996 | Stagaman ............ 355/72 |
| 6,084,938 A | * 7/2000 | Hara et al. | |

FOREIGN PATENT DOCUMENTS

| | | | |
|---|---|---|---|
| JP | 04255244 | 9/1992 | ......... H01L/21/68 |
| JP | 04336928 | 11/1992 | |
| WO | WO 01/90820 A1 | 5/2001 | ........... G03F/7/20 |

OTHER PUBLICATIONS

European Patent Office, International Search Report, Oct. 30, 2001 pp 1–4.

* cited by examiner

*Primary Examiner*—Russell Adams
*Assistant Examiner*—Khaled Brown
(74) *Attorney, Agent, or Firm*—Sterne, Kessler, Goldstein & Fox P.L.L.C.

(57) ABSTRACT

A flexible chuck for supporting a substrate during lithographic processing is described. This flexible chuck includes an electrode layer, a piezoelectric layer disposed on the electrode layer, and a substrate support layer disposed above the piezoelectric layer. By providing electrical signals to the piezoelectric layer through the electrode layer, the support layer can be flexed, thereby changing surface topography on a substrate disposed on the flexible chuck. The contact layer can include projections, each of the projections corresponding to a respective electrode within the electrode layer. Furthermore, the substrate support layer can be formed of a conductive material and thus serve as the ground layer. Alternatively, separate substrate support and ground layers can be provided. The flexible chuck in accordance with the instant invention can be a vacuum chuck. Also described is a method of monitoring topographic changes in a flexible chuck in accordance with the instant invention.

5 Claims, 7 Drawing Sheets

FLEXIBLE PIEZOELECTRIC CHUCK AND METHOD OF USING THE SAME

CROSS-REFERENCE TO RELATED APPLICATION

This application is related to U.S. application Ser. No. 09/575,997 filed May 23, 2000, now allowed, entitled "Method and System for Selective Linewidth Optimization During a Lithographic Process," the disclosure of which is hereby incorporated by reference.

BACKGROUND OF THE INVENTION

1. Field of the Invention

This invention relates to a chuck used to hold a substrate during a lithographic process. More specifically, this invention relates to a chuck capable of flexing during a lithographic process thereby altering the surface topography of a substrate mounted on the chuck.

2. Related Art

Lithography is a process used to create features on the surface of substrates. Such substrates can include those used in the manufacture of flat panel displays, circuit boards, various integrated circuits, and the like. A frequently used substrate for such applications is a semiconductor wafer. While this description is written in terms of a semiconductor wafer for illustrative purposes, one skilled in the relevant art would recognize that other substrates could be used without departing from the scope of the instant invention.

During lithography, a wafer is disposed on a wafer stage and held in place by a chuck. The chuck is typically a vacuum chuck capable of securely holding the wafer in place. The wafer is exposed to an image projected onto its surface by exposure optics located within a lithography apparatus. While exposure optics are used in the case of photolithography, a different type of exposure apparatus may be used depending on the particular application. For example, x-ray, ion, electron, or photon lithographies each may require a different exposure apparatus, as is known to those skilled in the relevant art. The particular example of photolithography is discussed here for illustrative purposes only.

The projected image produces changes in the characteristics of a layer, for example photoresist, deposited on the surface of the wafer. These changes correspond to the features projected onto the wafer during exposure. Subsequent to exposure, the layer can be etched to produce a patterned layer. The pattern corresponds to those features projected onto the wafer during exposure. This patterned layer is then used to remove exposed portions of underlying structural layers within the wafer, such as conductive, semiconductive, or insulative layers. This process is then repeated, together with other steps, until the desired features have been formed on the surface, or in various layers, of the wafer.

Step-and-scan technology works in conjunction with a projection optics system that has a narrow imaging slot. Rather than expose the entire wafer at one time, individual fields are scanned onto the wafer one at a time. This is done by moving the wafer and reticle simultaneously such that the imaging slot is moved across the field during the scan. The wafer stage must then be asynchronously stepped between field exposures to allow multiple copies of the reticle pattern to be exposed over the wafer surface. In this manner, the sharpness of the image projected onto the wafer is maximized. While using a step-and-scan technique generally assists in improving overall image sharpness, image distortions generally occur in such systems due to imperfections within the projection optics system, illumination system, and the particular reticle being used.

One technique for improving image sharpness has been proposed by Stagaman (U.S. Pat. No. 5,563,684). Stagaman observes that a conventional approach for improving image sharpness is to use a deformable chuck that flattens the wafer surface in order to conform that surface to the focal plane of the lens used. However, Stagaman further observes that the actual image pattern associated with a lens can differ from the theoretical flat focal plane of the lens, and so flattening the wafer's surface will not necessarily improve pattern sharpness for a particular lens. Thus, Stagaman suggests an approach whereby the actual focal pattern of a lens is determined. A deformable chuck is then used to conform the surface of the wafer to the actual focal pattern of the lens, thereby improving average image sharpness. Stagaman's chuck appears to work with individual adjustable pins that are extended or retracted in order to bend the surface of the wafer. The operation and details of these individually extendable pins are not fully described by Stagaman.

Taniguchi et al. (U.S. Pat. No. 4,475,223; "Taniguchi") appear to describe another type of flexible chuck that uses individual displacement units to produce displacement of a wafer disposed on the chuck. Such displacement units work individually, like the pins of Stagaman's chuck, discussed above. These displacement units can be screw elements controlled by DC motors. Taniguchi also describes that the displacement units can be various type of deformable elements, including piezoelectric elements.

Finally, MacDonald et al. (U.S. Pat. No. 5,094,536; "MacDonald") appear to describe another type of flexible chuck that uses individual actuators with extendable pins. The pins are arranged in an array on the chuck, the tips of the pins providing the surface on which a wafer can be placed. MacDonald's pins are formed of individual piezoelectric crystals. During operation, an electrical signal is supplied to each of the crystals, causing deformation of the wafer provided atop the array of pins.

In each of the approaches discussed above, actuators are individually formed and provided at the chuck surface. It is thus difficult to dispose the actuators such that each actuator surface lies in a single plane when the actuators are in an unbiased state. Furthermore, it is difficult to produce a high density of actuators according to the conventional structures discussed above.

Thus, what is needed is a simple to manufacture flexible chuck having a high density of actuators with coplanar contact surfaces.

SUMMARY OF THE INVENTION

The instant invention provides a flexible chuck that overcomes the shortcomings of the conventional flexible chucks discussed above.

In one embodiment, a flexible chuck for supporting a substrate during lithographic processing is described. This flexible chuck includes an electrode layer, a piezoelectric layer disposed on the electrode layer, and a substrate support layer disposed above the piezoelectric layer. The piezoelectric layer deforms in response to voltage variations applied across the layer. Thus, by providing electrical signals to the piezoelectric layer through the electrode layer, the substrate support layer can be flexed, thereby changing surface topography on a substrate disposed on the flexible chuck. The magnitude of the electrical signals provided affects the amount of deformation within the piezoelectric layer, and thus the degree of flex exhibited by the substrate support layer.

The substrate support layer can include projections, each of the projections corresponding to a respective electrode within the electrode layer. Furthermore, the substrate support layer can be formed of a conductive material and thus serve as a ground layer. Alternatively, separate substrate support and ground layers can be provided. The flexible chuck in accordance with the instant invention can be a vacuum chuck.

A piezoelectric layer within a flexible chuck in accordance with the instant invention can include projections corresponding the projections within the substrate support layer. Alternatively, the piezoelectric layer can be substantially flat. Alternatively, rather than a piezoelectric layer, a flexible chuck in accordance with the instant invention can include a plurality of discrete piezoelectric elements formed from a substantially flat piezoelectric layer disposed on the electrode layer.

Projections within a flexible chuck in accordance with the instant invention can include one of point projections and strip projections. Additionally, a solid circular projection region can be included that corresponds to a peripheral top surface of the flexible chuck.

A flexible chuck in accordance with the instant invention can further include power and signal interconnection lines for addressing individual electrodes within the electrode layer.

A flexible chuck in accordance with the instant invention can also further include at least one grounded guard ring for confining electric fields produced by the electrical signals applied to the piezoelectric layer.

A flexible chuck in accordance with the instant invention can also further include an interconnection back plate that incorporates at least one of multiplexing and switching hardware.

A flexible chuck in accordance with the instant invention can also include a cooling plate.

A flexible chuck in accordance with the instant invention can also include both a main chuck assembly and a riser assembly for lifting a substrate off of the substrate support layer.

A method of monitoring topographic changes within a flexible chuck in accordance with the instant invention is also desribed. The method can include a first step of sensing a first capacitance across an actuator within the flexible chuck. Next, a step of modifying a voltage across the actuator is performed. Following this, a step of sensing a second capacitance across the actuator is performed. Finally, a step of comparing the first capacitance to the second capacitance is performed, thereby monitoring changes within the flexible chuck.

BRIEF DESCRIPTION OF THE FIGURES

The accompanying drawings, which are incorporated herein and form part of the specification, illustrate the present invention and, together with the description, further serve to explain the principles of the invention and to enable a person skilled in the pertinent art to make and use the invention. Like reference numbers refer to like elements within the different figures.

DETAILED DESCRIPTION OF THE PREFERRED EMBODIMENTS

Figure 1:
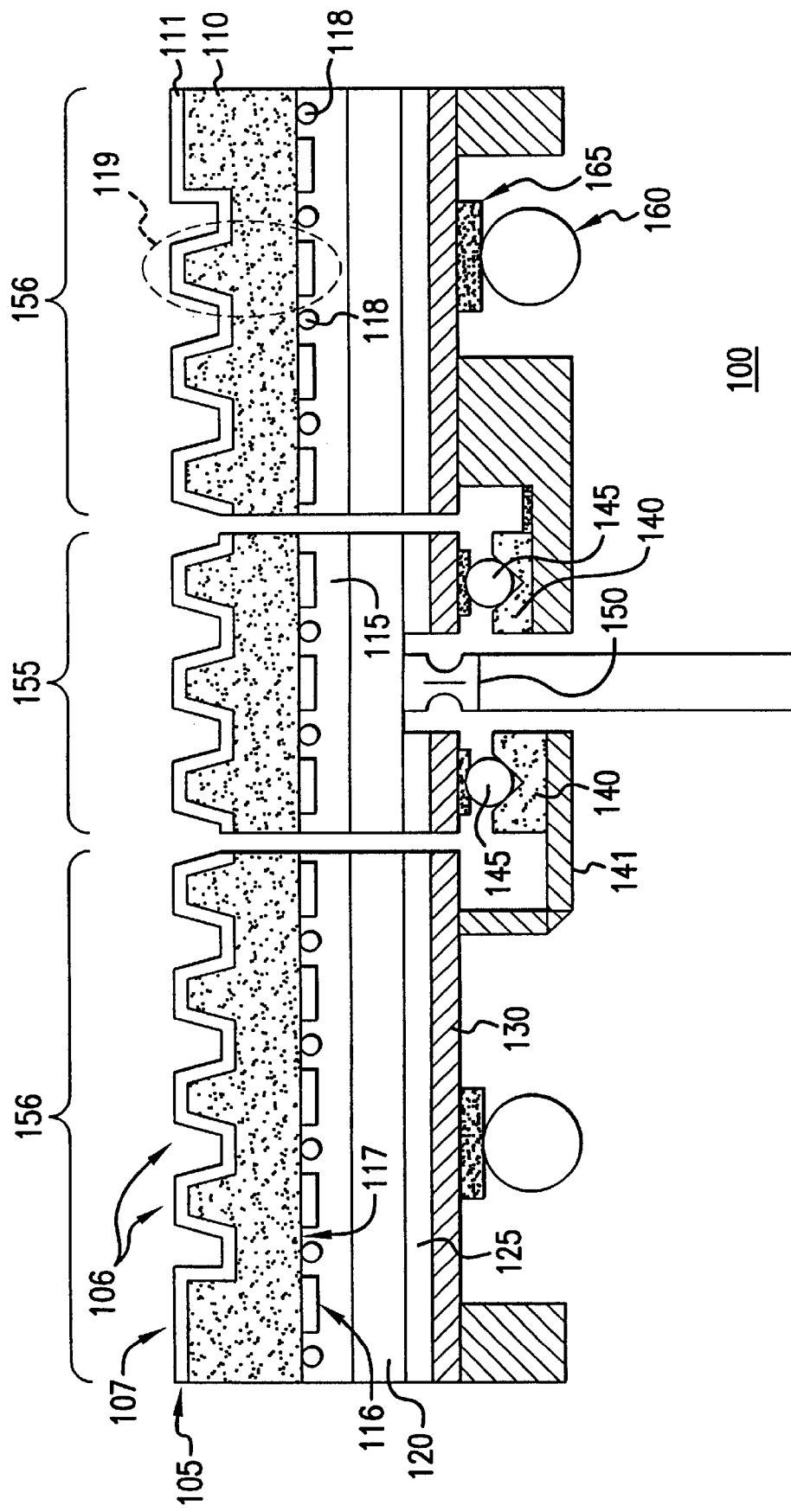
FIG. 1 illustrates a first flexible chuck in accordance with the instant invention.

FIG. 1 illustrates a flexible piezoelectric chuck 100 in accordance with a first embodiment of the instant invention. Flexible piezoelectric chuck 100 includes a wafer contact surface 105. Wafer contact surface 105 is formed by the outer peripheral top surface 107 of chuck 100 as well as by the tops of chuck surface projections 106. The spaces between chuck surface projections 106 serve to isolate these projection electrically; the deeper the space between projections, the greater amount of isolation provided. Additional isolation can be provided with grounded guard rings, discussed below. A piezoelectric layer 110 is provided as the active layer of the piezoelectric chuck 100. The piezoelectric layer 110 can be formed of lead zirconate titanate. Alternatively, other piezoelectric materials known to those skilled in the relevant art can be used without departing from the scope of the instant invention. The piezoelectric layer 110 includes surface projections that form the chuck surface projections 106.

Disposed on the surface of the piezoelectric layer 110 is a substrate support layer 111. The substrate support layer 111 can serve as a ground layer, as will be discussed more fully below. Substrate support layer 111 can be formed of nickel or any other ohmic contact material suitable for substrate support, as would be apparent to one skilled in the relevant art given this disclosure.

An electrode layer 116 is formed on the bottom surface of piezoelectric layer 110. Electrode layer 116 can be formed of nickel and includes individual electrodes, not labeled. Alternatively, electrode layer 116 can be formed of any other suitable conductor as would be apparent to one skilled in the relevant art given this disclosure.

The piezoelectric layer 110 deforms in response to voltage variations applied across the layer. Thus, by providing electrical signals to the piezoelectric layer through the electrode layer 116, the piezoelectric layer 110 can be deformed, thus flexing the substrate support layer 111. This, in turn, changes the surface topography on a substrate disposed on the flexible chuck. The magnitude of the electrical signals provided controls the degree of flex exhibited by the substrate support layer.

Also provided on the bottom surface of the piezoelectric layer 110 are power and signal interconnection lines 118 for communicating with individual electrodes among the electrode layer 116. As with electrode layer 116, the power and signal interconnection lines 118 may be formed of any suitable conductor material, as would be apparent to one skilled in the relevant art. As can be seen from FIG. 1, chuck surface projections 106 each correspond to an underlying electrode within the electrode layer 116 on the bottom surface of the piezoelectric layer 110. Thus, the combination of an individual chuck surface projection 106, the associated electrode within electrode layer 116, a corresponding region of piezoelectric layer 110, and an associated portion of the substrate support layer 111 (e.g,.a wafer contact layer) together create an individual actuator 119. A voltage applied across this actuator 119 will cause it to expand or contract in accordance with the magnitude of the voltage applied. This expansion or contraction is a result of the piezoelectric characteristic of the piezoelectric layer 110. The actual structure of chuck surface projections 106 will be discussed more fully in connection with FIGS. 4A and 4B, below.

A grounded guard ring 117 for confinement of individual actuator electric fields can be provided between individual electrodes within the electrode layer 116. While only one such grounded guard ring 117 is depicted in FIG. 1, more such grounded guard rings could be provided between individual electrodes within the electrode layer 116. The optional grounded guard rings 117 can thus be provided to confine individual actuator electric fields corresponding to neighboring actuators. While the presence of grounded guard rings 117 serves to further isolate individual actuators, such grounded guard rings are not necessary and so could be omitted without departing from the scope of the instant invention.

Electrode layer 116, power and signal interconnections 118, and grounded guard ring 117 can be formed through the use of conventional techniques such a plating, printing, and patterning, as would be apparent to one skilled in the relevant art.

An insulating bond material 115 is applied on the bottom surface of piezoelectric layer 110 to cover the electrode layer 116, the power and signal interconnection lines 118, and the optional grounded guard rings 117. The insulating bond material 115 can include an epoxy like that used in the printed circuit board industry. Alternatively, any other insulating bond material sufficient to encapsulate the electrode layer 116, optional grounded guard rings 117, and power and signal interconnection lines 118, as well as to further bond this structure to underlying layers, could be used, as would be apparent to a person skilled in the relevant art given this disclosure.

An interconnection back plate 120 can be disposed on the surface of insulating bond material layer 115. The interconnection back plate 120 can be used for incorporating multiplexing or switching hardware. By placing multiplexing or switching hardware within the interconnection backplate 120, fewer interconnections need be made to the flexible piezoelectric chuck 100. Thus, instead of having an interconnection to the flexible chuck 100 for each electrode within the electrode layer 116, a small number of interconnections can be made to the flexible piezoelectric chuck 100. These interconnections can then be multiplexed to the appropriate electrode within electrode layer 116 by the multiplexing or switching hardware within the optional interconnection back plate 120. Interconnection back plate 120 can be a printed circuit board or a semiconductor layer comprising an integrated circuit or any other type of layer within which multiplexing or switching hardware can be disposed, as would be apparent to one skilled in the relevant art given this disclosure. Alternatively, the interconnection back plate 120 could be omitted without departing from the scope of the instant invention.

A cooling plate 125 can be disposed on the bottom surface of interconnection back plate 120. Cooling plate 125 can be a fluid cooling plate that allows the flow of gas or liquid through the cooling plate, as would be apparent to one skilled in the relevant art. Alternatively, cooling plate 125 can comprise a layer of material having high thermal conductivity, such as a metal. Alternatively, the cooling plate 125 could be omitted without departing from the scope of the instant invention.

A back plate 130 is provided at the bottom of flexible piezoelectric chuck 100. Back plate 130 serves to stiffen the flexible piezoelectric chuck 100, as well as to provide a reference and interface support structure. Back plate 130 can be made of a ceramic, a metal, or any other material capable of providing a stiffening support layer.

Chuck registration balls 160 are provided on a lower surface of back plate 130. Chuck registration balls 160 are used for registration and support of flexible piezoelectric chuck 100 on an underlying structure, such as a wafer stage. Chuck registration balls 160 can be formed of metal, or any other material sufficient to support flexible chuck 100, as would be apparent to one skilled in the relevant art. Chuck registration balls 160 can be attached to the back plate 130 through the use of an epoxy, solder, or the like 165. Chuck registration balls 160 can be formed of metal and attached to back plate 130 with a solder 165 to provide for a ground connection to the rear of flexible piezoelectric chuck 100, if desired. While chuck registration balls are used in connection with the structure of FIG. 1, other types of registration systems can be used without departing from the instant invention, as would be apparent to one skilled in the relevant art.

As can be seen from FIG. 1, piezoelectric chuck 100 can be divided into a main chuck assembly 156 and a riser assembly 155. The main chuck assembly 156 and the riser assembly 155 are formed of the materials discussed above. The riser assembly 155 is physically separate from the main chuck assembly 156. The riser assembly 155 has riser registration balls 145 disposed on a rear surface of the riser assembly 155 in the same manner as chuck registration balls 160 are disposed on the rear surface of piezoelectric chuck 100. The riser assembly 155 also has a flexible riser coupling 150 disposed on a rear surface. The purpose of riser assembly 155 will next be explained.

During a lithographic process, a wafer is adhered to the wafer contact surface 105 of flexible piezoelectric chuck 100 through the application of a vacuum force. The regions between chuck surface projections 106 provide an area for the vacuum to exert a force on the rear of a wafer disposed on wafer contact surface 105. In order to remove a wafer from the flexible piezoelectric chuck 100, the vacuum is released, eliminating the force applied to the rear of the wafer. However, even though the vacuum is released, the wafer must still be lifted off the wafer contact surface 105 of flexible piezoelectric chuck 100. In order to accomplish this, a riser assembly 155 can be provided. As mentioned above, riser assembly 155 is physically separate from the main chuck assembly 156. In order to lift a wafer up off of the wafer contact surface 105, the riser assembly 155 is extended upward, away from the wafer contact surface 105, with a vacuum applied to the riser assembly only. This upward movement of the riser assembly 155 is controlled by the flexible riser coupling 150 located at the bottom of the riser assembly 155. It should be apparent to one skilled in the relevant art that riser assembly 155 need not be extended all the way out of the main chuck assembly 156. Rather, the riser assembly 155 need only be extended far enough away from the main chuck assembly 156 to allow a wafer disposed at the surface of flexible chuck 100 to be easily grasped.

While the riser assembly 155 is physically separated from the main chuck assembly 156, electrical connections must still be made to the various electrical connectors disposed on the bottom surface of the piezoelectric layer within the riser assembly 155. In order to make these electrical connections, a flexible electrical connector, not shown, is disposed between the main chuck assembly 156 and the riser assembly 155. During operation, when a wafer is disposed on the wafer contact surface 105, the riser assembly is seated on kinematic riser registration magnets 140. Kinematic riser registration magnets 140 are disposed on a supporting member 141 that extends from the back plate 130. Thus, kinematic riser registration magnets 140 serve as seats for riser registration balls 145. Alternatively, a non-magnetic riser registration system could be used without departing from the scope of the instant invention. Furthermore, while the advantages of using a riser assembly have been discussed above, such a riser assembly could be omitted from the flexible piezoelectric chuck without departing from the scope of the instant invention. Except as otherwise described, the various layers of the structure shown in FIG. 1, as well as those shown in the other figures discussed below, are formed of materials apparent to those skilled in the relevant art given this disclosure. Likewise, the actual formation and bonding of the various layers can be carried out in a manner apparent to one skilled in the relevant art given this disclosure, except as otherwise described.

Figure 4A:
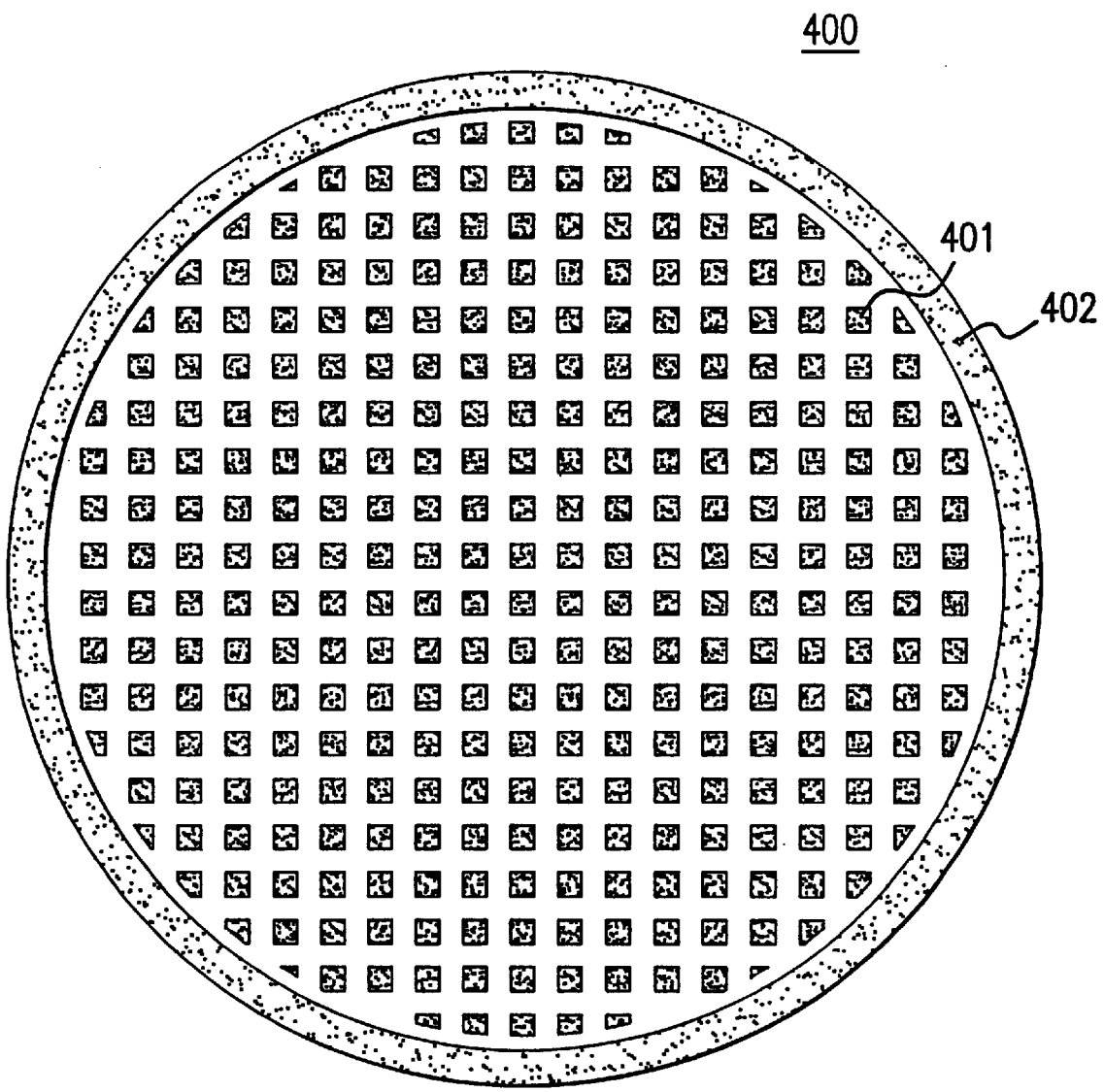
FIGS. 4A and 4B illustrate different surface projection structures that can be used with a flexible chuck in accordance with the instant invention.
Figure 4B:
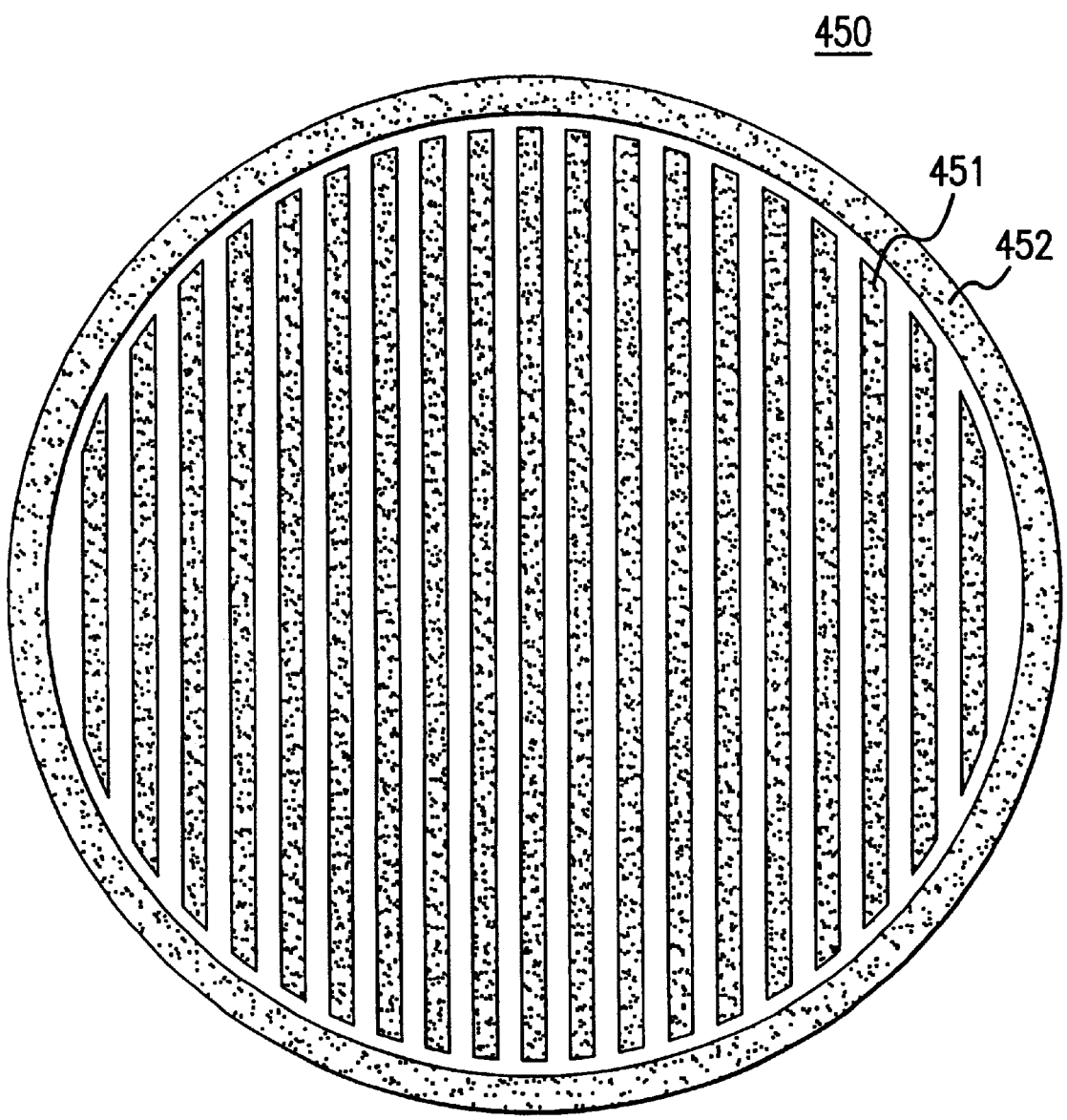

The formation and arrangement of the chuck surface projections 106 will now be discussed. Chuck surface projections 106, and thus individual actuators 119, can be formed using conventional lithographic processing techniques. Thus, a single layer of piezoelectric material is processed to produce the chuck surface projections 106. The thickness of the piezoelectric layer can be from 0.1 to 10 millimeters, and preferably between 0.5 and 1 millimeters, though other thicknesses could be used without departing from the scope of the instant invention. The particular thickness chosen is related to the degree of surface profiling desired. Greater surface profiling results from the use of a thicker piezoelectric layer. Using a piezoelectric layer having a thickness between 0.5 and 1 millimeters results in peak to valley surface profiling capabilities of greater than 500 nanometers. Chuck surface projections 106 can be formed as individual point projections or as strip projections as will now be described in connection with FIGS. 4A and 4B. FIGS. 4A and 4B illustrate two alternative structures for the surface of flexible piezoelectric chuck 100. FIG. 4A illustrates a point projection structure 400, while FIG. 4B illustrates a strip projection surface structure 450.

In the point projection structure 400 of FIG. 4A, the chuck surface projections 106 of piezoelectric chuck 100 have been formed as a plurality of truncated pyramid-like structures 401. Thus, as seen in FIG. 4A, the chuck surface projections are ranged as an array of point projections each having a substantially square surface. In addition to point projections 401, a solid circular projection region 402 that corresponds to peripheral top surface of flexible piezoelectric chuck 100 of FIG. 1. This circular region 402, serves as a boundary to confine the vacuum that is applied during operation. Circular region 402 can be flexed so as to conform the peripheral region of an uneven wafer, so as to maintain a seal. Alternatively, circular region 402 can be flexed so as to produce an intentional, and controllable, vacuum leak.

The size and density of projections 401 in the point projection structure 400 is limited only by the limitations of lithographic processing techniques. Thus, while the structure has been described as an array of truncated pyramid structures, various structures, shapes, and sizes of the chuck surface projections could be formed without departing from the scope of the instant invention. For example, radially extending projections or concentric circular projections could be formed. Furthermore, since projections 401 can be formed during a single photo lithographic processing technique from a single piezoelectric layer 110, the surfaces of the point projections 401 will lie in a single plane. Thus, the difficult step of placing the tops of all the piezoelectric actuators in a single plane faced by the conventional methods discussed above is overcome in the instant invention by forming all of the surface projections from a single piezoelectric layer. Additionally, the distance between adjacent surface projections 106 is limited only by the tolerance of the lithographic processing technique used. The particular techniques used to form surface projections 106 can include etching, scribing, or any other patterning technique known to those skilled in the relevant art. Alternatively, a molding technique could be used to form the point projections 401.

FIG. 4B illustrates a strip projection structure 450 for the surface of the piezoelectric chuck 100. The strip projection structure 450 of FIG. 4B differs from that of FIG. 4A in that the surface projections are continuous strip projections 451, rather than the point projections 401 of the structure of FIG. 4A. As with the point projection structure 450, the strip projection structure 450 includes a solid circular projection region 452 that corresponds to peripheral top surface of flexible piezoelectric chuck 100 of FIG. 1. This circular region 452, serves as a boundary to confine the vacuum that is applied during operation. The techniques used to form the strip surface structure 450 of FIG. 4B can include the same techniques used to form the structure FIG. 4A, as would be apparent to a person skilled in the relevant art given this disclosure.

The point projection structure 400 of FIG. 4A allows contouring of the wafer contact surface 105 of flexible piezoelectric chuck 100 in two perpendicular directions, while the strip projection structure 450 of FIG. 4B allows contouring of the wafer contact surface 105 of flexible piezoelectric chuck 100 in only one direction. Each structure has its advantages. With the point projection structure 400, the power required to activate a single actuator 119 is much less than that required to activate a strip actuator of the strip projection structure 450. On the other hand, the strip projection structure 450 includes fewer total actuators than the point projection structure 400. Thus, the wiring for and the addressing of, individual actuators in the structure FIG. 4B is simpler than that of FIG. 4A. In many cases, it is only necessary to contour the surface of a wafer along a single direction, and so the structure of FIG. 4B is adequate. Thus, the surface projections 106 of piezoelectric chuck 100 can be made in accordance with the structures of FIG. 4A or 4B as would apparent to one skilled in the relevant art given this disclosure. Furthermore, since chuck surface projections 106 are formed through lithographic processing any pattern of surface projections could be made without departing from the scope of the instant invention.

Figure 2:
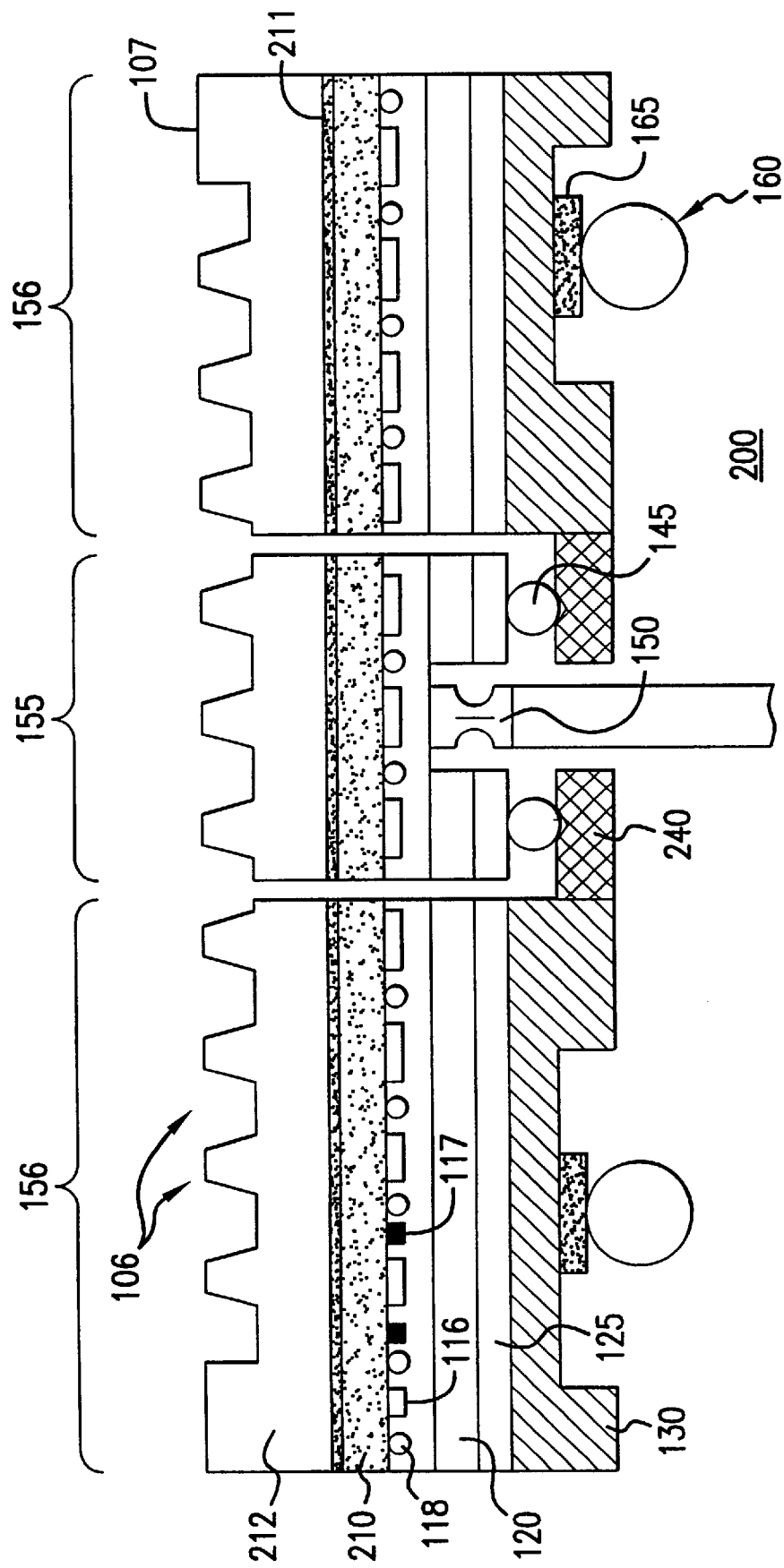
FIG. 2 illustrates a second flexible chuck in accordance with the instant invention.

FIG. 2 illustrates a second piezoelectric chuck 200 in accordance with the instant invention. Flexible chuck 200 includes many of the same elements as flexible chuck 100. Thus, like numbered elements will not be described again in connection with FIG. 2. Piezoelectric chuck 200 includes a chuck front plate 212. Chuck front plate 212 can be formed of aluminum. Alternatively, chuck front plate 212 can be formed of another material capable of patterning in order to produce chuck projections 106, as would be apparent to a person skilled in the relevant art given this disclosure. Front plate 212 can be formed with any desired projection arrangement, for example those of FIGS. 4A and 4B.

Piezoelectric chuck 200 includes piezoelectric layer 210. Piezoelectric layer 210 is substantially flat and can be formed of lead zirconate titanate as with the structure of FIG. 1, or can be formed with any other piezoelectric material, as would be apparent to a person skilled in the relevant art given this disclosure. Formed atop piezoelectric layer 210, is a ground plane 211. Preferably, ground plane 211 is a surface plating of piezoelectric layer 210, though this ground plane 211 could be any type of layer sufficient to form a ground plane for use within the piezoelectric chuck 200. Alternatively, ground plane 211 could be omitted if chuck front plate 212 is formed of a conductor and implemented as a ground plane, as would be apparent to a person skilled in the relevant art. Flexible piezoelectric chuck 200 includes a combined riser registration and support structure 240. This structure is a combination of the associated elements 140 and 141 of the structure 100 of FIG. 1. Riser registration and support structure 240 can be an integral extension of back plate 130, and thus formed of the same material, or it can be formed of another material and bonded to back plate 130 in a manner apparent to one skilled in the relevant art. For example, if a magnetic mounting arrangement is desired, riser registration and support structure could be formed of a magnetic material bonded to back plate 130.

Figure 3:
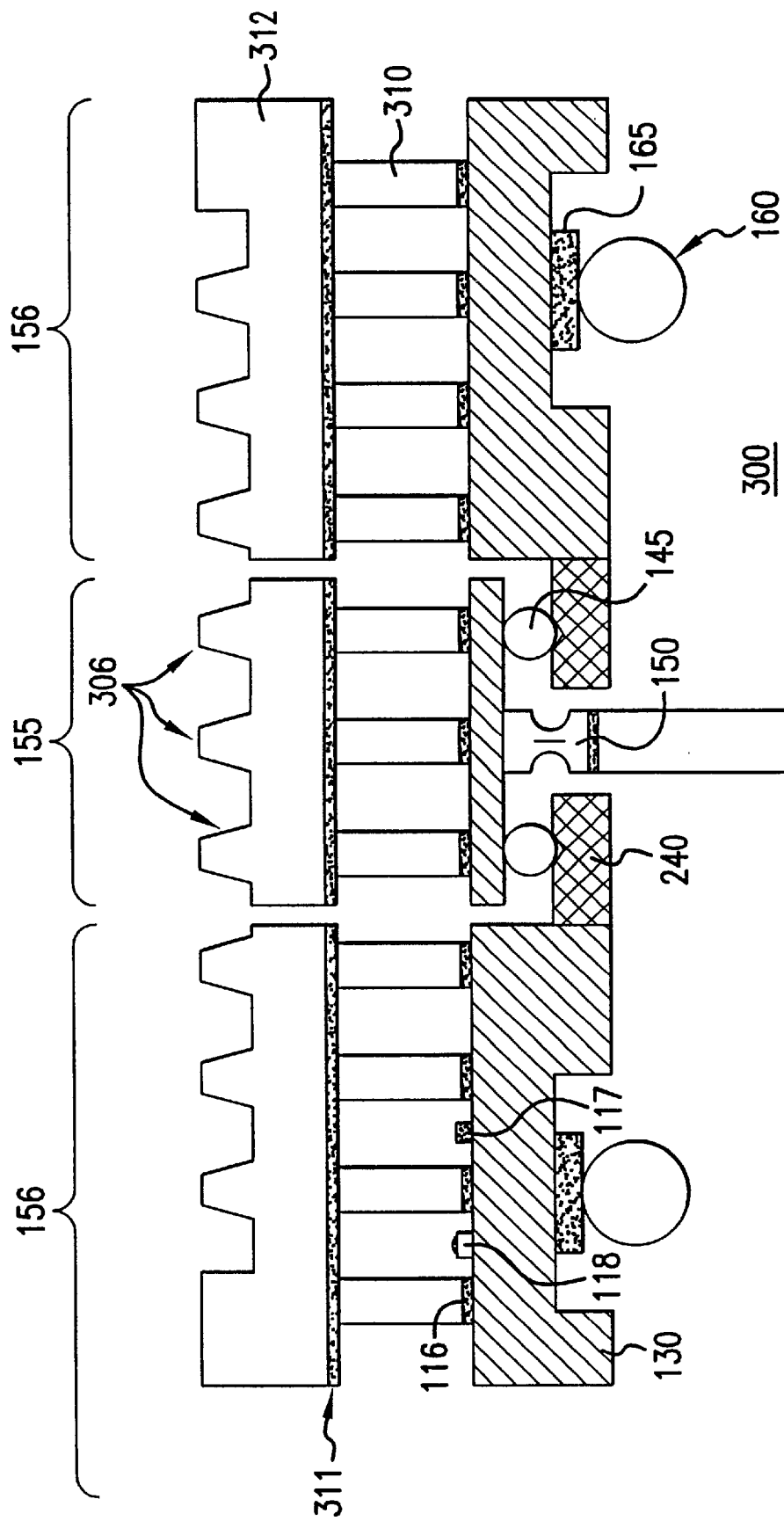
FIG. 3 illustrates a third flexible chuck in accordance with the instant invention.

FIG. 3 illustrates a third piezoelectric chuck 300 in accordance with the instant invention. Elements numbered similarly to elements of FIG. 1 are formed of the same materials and will not be described again in connection with the structure of FIG. 3. Piezoelectric chuck 300 includes a chuck front plate 312 that can be formed of aluminum. Alternatively, chuck front plate 312 can be formed of any material capable of patterning and suitable for supporting a substrate, as would be apparent to a person skilled in the relevant art given this disclosure. Chuck front plate 312 is formed atop a ground plane 311. Unlike the structures of FIGS. 1 and 2, the piezoelectric layer of the structure of FIG. 3 has been formed into discrete piezoelectric elements 310. Individual piezoelectric elements 310 have been formed by simply etching all the way through a substantially flat piezoelectric layer used to form these elements. The arrangement of piezoelectric elements 310 corresponds to surface projections 306. Thus, piezoelectric elements 310 are formed in accordance with either the structure 4A, or the structure 4B, or any other structure that would be apparent to one skilled in the relevant art given this disclosure. Piezoelectric elements 310 are contacted on a chuck surface side by piezoelectric ground plane 311. Alternatively, ground plane 311 can be omitted if chuck front plate 312 is formed of a conductor and implemented as a ground plane, as would be apparent to a person skilled in the relevant art.

The piezoelectric chucks described above can be used to produce focus offsets through changes in surface topographies. Thus, a piezoelectric chuck according to the present invention can be used in a method and system as described in co-pending U.S. application Ser. No.: 09/575,997 "Method and System for Selective Linewidth Optimization During a Lithographic Process," filed concurrently herewith. Additionally, a piezoelectric chuck according to the present invention can be used to alleviate wafer backside contamination that causes surface topographic changes. Such topographic changes are a result of, for example, a particle that lands on the backside of a wafer during processing. Such a particle, when disposed between the wafer and a support structure, can produce a change in elevation at the surface of the wafer. The present invention allows the piezoelectric chuck surface to change in topography, thus compensating for the presence of such a particle.

Figure 5A:
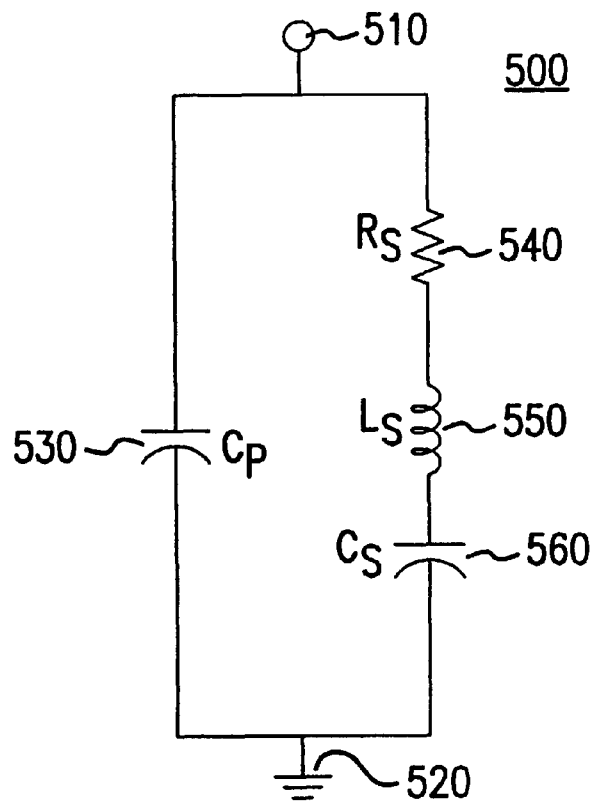
FIG. 5A illustrates an equivalent circuit corresponding to an actuator within a flexible chuck in accordance with the instant invention.
Figure 5B:
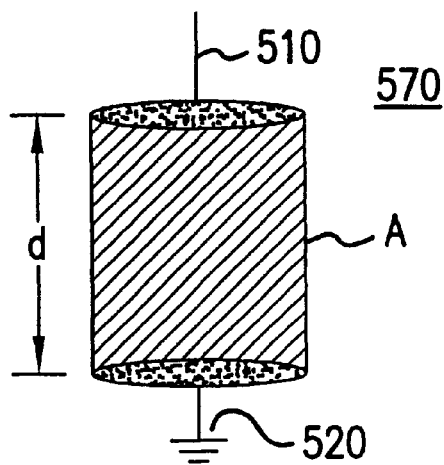
FIG. 5B is spatial diagram of the parallel capacitance of an actuator within a flexible chuck in accordance with the instant invention.

A further advantage of the present invention is that the structures described above in connection with FIGS. 1 through 4B are capable of producing feedback control signals indicative of changes in surface topography. Returning again to FIG. 1, each individual actuator 119 can be modeled as an equivalent circuit. FIG. 5A illustrates an equivalent circuit 500 representative of an actuator like that 119 of FIG. 1. The actuator's individual electrode of electrode layer 116 is represented by a first circuit node 510 while the wafer contact/ground layer is represented by a second circuit node 520. A parallel capacitance is represented by a first capacitor Cp 530. A series resonance circuit is represented by a second capacitor Cs 560, a first resistor Rs 540, and a first inductor Ls 550. At frequencies lower than parallel and series resonance frequencies, the parallel capacitance Cp is approximately equal to the packaging capacitance. Packaging capacitance will be described with reference to FIG. 5B. FIG. 5B illustrates a spatial diagram 570 of the equivalent parallel capacitor Cp 530 corresponding to the individual actuator 119 represented in FIG. 5A. As shown in FIG. 5B, d represents the distance between the two plates of the capacitor, analogous to the substrate support layer 111 and an individual electrode of electrode layer 116 of the actuator 119 shown in FIG. 1. A represents the cross-sectional area between the two plates of the capacitor. As would be apparent to one skilled in the relevant art, fluctuations in the piezoelectric layer 110 cause corresponding changes in d, while A remains substantially constant.

At frequencies lower than the resonance frequency of the individual actuator 119, the packaging capacitance of actuator 119 is approximately equal to the parallel capacitance Cp, and so the latter can be expressed by the following formula: $Cp \cong (\epsilon^* A)/d$; where $\epsilon = \epsilon_0 ^* \epsilon_r$; where $\epsilon_0$ is the permittivity constant ($8.85 \times 10^{-12}$ F/m) and $\epsilon_r$ is the permittivity of the particular piezoelectric material being used, for example lead zirconate titanate. Since A and e are constant of any actuator, the parallel capacitance of an actuator 119 has a direct correspondence to changes in the distance d, as shown in FIG. 5B. Since changes in this distance within an individual actuator 119 correspond to topographic changes in the surface to a wafer mounted on the piezoelectric chuck 100, 200, 300, sensing changes in capacitance across an actuator 119 can be used to detect whether desired topographic changes have occurred. This is discussed more fully in connection with FIG. 6, below.

Figure 6:
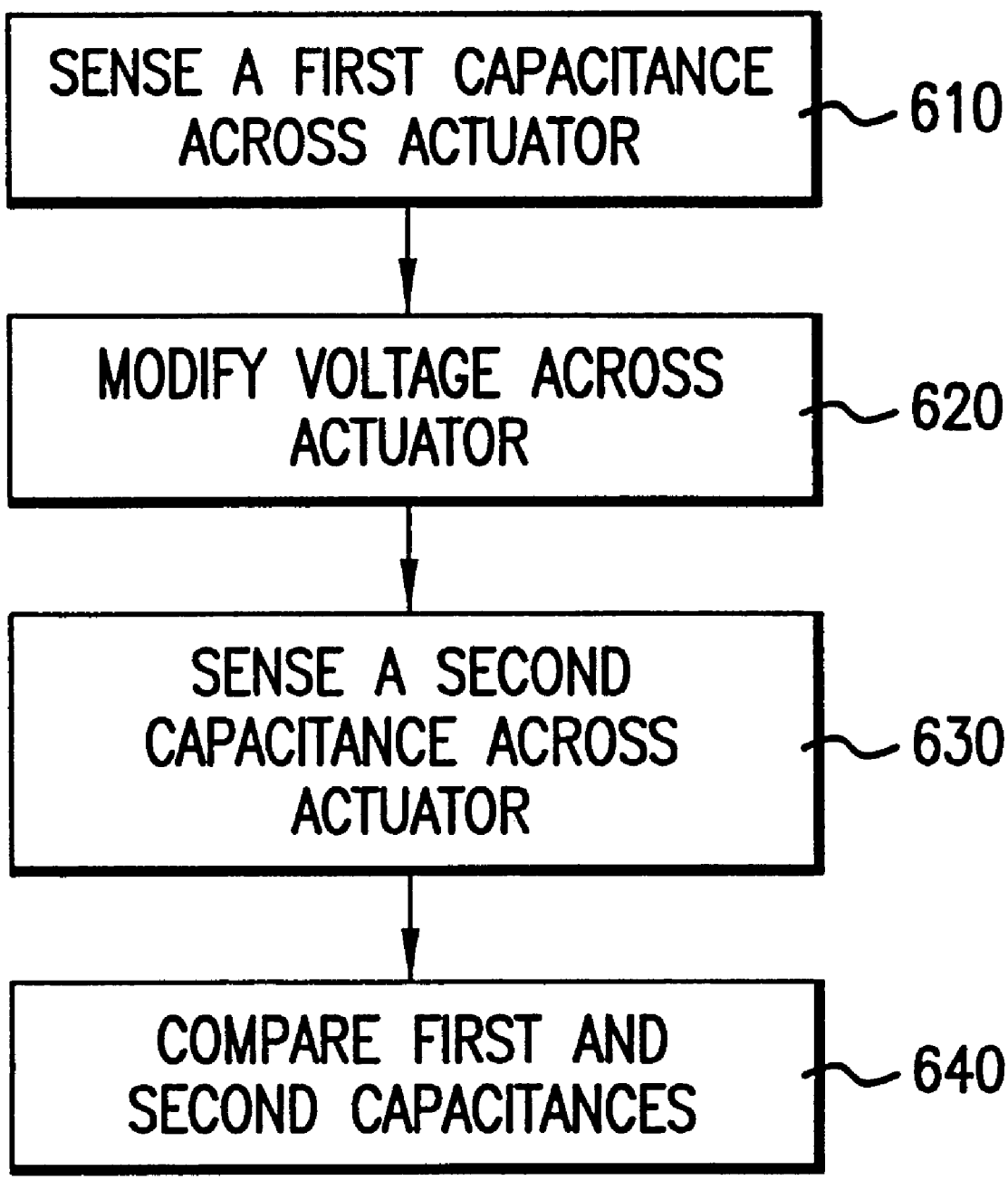
FIG. 6 illustrates the steps in a method of monitoring topographic changes in a flexible chuck in accordance with the instant invention.

FIG. 6 illustrates a method 600 of using actuator capacitance to monitor topographic changes in a piezoelectric chuck. In a first step 610, a first capacitance is sensed across an actuator. In a second step 620, a voltage across the actuator is modified. This modification could be a transition from an un-biased state, i.e. no voltage across the actuator, to a biased state. Alternatively, this modification could be from any first applied voltage to any second applied voltage. Such voltages are applied to an actuator 119 through an electrode in electrode layer 116 and are measured between the applied electrode and the wafer contact/ground layer 111. Once the voltage has been modified in the second step 620, a third step 630 of sensing a second capacitance across the actuator is performed. Finally, a step 640 of comparing the first and second capacitances is performed. By comparing the first and second sensed capacitances, it can be determined whether the desired change in the topography of a wafer mounted on the surface of the piezoelectric chuck has occurred. This determination can be made because and difference in the first and second measured capacitances results from a change in thickness of the piezoelectric layer within the particular actuator 119. The measuring of capacitance across the actuator as well making the determination of the final step 640 could be performed through any conventional technique apparent to one skilled in the relevant art given this disclosure. For example, charge flow in to and out of the actuators can be used to measure capacitance changes.

CONCLUSION

While various embodiments of the present invention have been described above, it should be understood that they have been presented by way of example only, and not limitation. For example, while the invention has been described in terms of a wafer, one skilled in the art would recognize that the instant invention could be applied to any type of substrate used in a lithography process. It will be understood by those skilled in the art that various changes in form and details can be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. A flexible chuck for supporting a substrate during lithographic processing, comprising:

an electrode layer;

a piezoelectric layer disposed on said electrode layer;

a substrate support layer disposed above said piezoelectric layer, wherein said electrode layer provides electrical signals to said piezoeletric layer thereby causing said piezoelectric layer to deform in response to said electric signals; and a cooling plate.

2. A flexible chuck for supporting a substrate during lithographic processing, comprising:

an electrode layer;

a piezoelectric layer disposed on said electrode layer;

a substrate support layer disposed above said piezoelectric layer, wherein said electrode layer provides electrical signals to said piezoeletric layer thereby causing said piezoelectric layer to deform in response to said electric signals; and a main chuck assembly and a riser assembly that lift the substrate off of said substrate support layer.

3. The flexible chuck of claim 2, wherein said flexible chuck is a vacuum chuck.

4. A flexible chuck for adjusting the height of a substrate during lithographic processing, comprising:

an electrode layer;

a plurality of discrete piezoelectric elements formed from a substantially flat piezoelectric layer disposed on said electrode layer;

a ground plane; and a cooling plate.

5. A flexible chuck for adjusting the height of a substrate during lithographic processing, comprising:

an electrode layer;

a plurality of discrete piezoelectric elements formed from a substantially flat piezoelectric layer disposed on said electrode layer;

a ground plane; and a main chuck assembly and a riser assembly that lift the substrate off of said plurality of discrete piezoelectric elements.

* * * * *